United States Patent
Endo et al.

(10) Patent No.: US 6,992,015 B2
(45) Date of Patent: Jan. 31, 2006

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 141 days.

(21) Appl. No.: 10/643,929

(22) Filed: Aug. 20, 2003

(65) Prior Publication Data

US 2004/0224525 A1 Nov. 11, 2004

(30) Foreign Application Priority Data

May 9, 2003 (JP) .............................. 2003-131159

(51) Int. Cl.
*H01L 21/302* (2006.01)
(52) U.S. Cl. ...................... 438/745; 438/948; 438/949
(58) Field of Classification Search ................ 438/949, 438/8, 745, 948
See application file for complete search history.

(56) References Cited

U.S. PATENT DOCUMENTS 5,518,579 A * 5/1996 Katsuyama et al. ........ 438/782
5,580,702 A * 12/1996 Hayase et al. .............. 430/326
6,699,645 B2 * 3/2004 Takahashi et al. .......... 430/326

FOREIGN PATENT DOCUMENTS

JP 2001-316863 11/2001

OTHER PUBLICATIONS

M. Switkes et al., "Immersion lithography at 157 nm", J. Vac. Sci. Technolo., B19(6), (2001), pp. 2353-2356.

* cited by examiner

*Primary Examiner*—David Nelms
*Assistant Examiner*—Quoc Hoang
(74) *Attorney, Agent, or Firm*—McDermott Will & Emery LLP

(57) ABSTRACT

After forming a resist film made from a chemically amplified resist material, pattern exposure is carried out by selectively irradiating the resist film with exposing light while supplying, onto the resist film, water that includes triphenylsulfonium nonaflate, that is, an acid generator, and is circulated and temporarily stored in a solution storage. After the pattern exposure, the resist film is subjected to post-exposure bake and is then developed with an alkaline developer. Thus, a resist pattern made of an unexposed portion of the resist film can be formed in a good shape.

14 Claims, 9 Drawing Sheets

PATTERN FORMATION METHOD

BACKGROUND OF THE INVENTION

The present invention relates to a pattern formation method for use in fabrication process and the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been proposed for realizing further refinement of patterns by using conventional exposing light (M. Switkes and M. Rothschild, "Immersion lithography at 157 nm", J. Vac. Sci. Technol., B19, 2353 (2001)).

In the immersion lithography, a region in an exposure system sandwiched between a projection lens and a resist film formed on a wafer is filled with a solution having a refractive index n, and therefore, the NA (numerical aperture) of the exposure system has a value n·NA. As a result, the resolution of the resist film can be improved.

Now, a first conventional pattern formation method using the immersion lithography will be described with reference to FIGS. 8A through 8D.

First, a positive chemically amplified resist material having the following composition is prepared:

Base polymer: poly((norbornene-5-methylene-t-butylcarboxylate)—(maleic anhydride))(wherein norbornene-5-methylene-t-butylcarboxylate:maleic anhydride=50 mol %:50 mol %) . . . 2 g Acid generator: trifluorosulfonium triflate . . . 0.06 g Solvent: propylene glycol monomethyl ether acetate . . . 20 g Next, as shown in FIG. 8A, the aforementioned chemically amplified resist material is applied on a substrate 1 so as to form a resist film 2 with a thickness of 0.35 μm.

Then, as shown in FIG. 8B, while supplying water 3A onto the resist film 2, pattern exposure is carried out by irradiating the resist film 2 with exposing light 4 of ArF excimer laser with NA of 0.65 through a mask 5. Although a projection lens for projecting the exposing light 4 having passed through the mask 5 on the surface of the resist film 2 is not shown in FIG. 8B, a region sandwiched between the projection lens and the resist film 2 is filled with the water 3A. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 5C, the resist film 2 is baked with a hot plate at a temperature of 110° C. for 60 seconds, and the resultant resist film is developed with a 2.38 wt % tetramethylammonium hydroxide developer (alkaline developer). In this manner, a resist pattern 6A made of the unexposed portion 2b of the resist film 2 can be obtained as shown in FIG. 8D.

Next, a second conventional pattern formation method using the immersion lithography will be described with reference to FIGS. 9A through 9D.

First, a positive chemically amplified resist material having the following composition is prepared:

Base polymer: poly((norbornene-5-methylene-t-butylcarboxylate)—(maleic anhydride))(wherein norbornene-5-methylene-t-butylcarboxylate:maleic anhydride=50 mol %:50 mol %) . . . 2 g Acid generator: trifluorosulfonium triflate . . . 0.06 g Solvent: propylene glycol monomethyl ether acetate . . . 20 g Next, as shown in FIG. 9A, the aforementioned chemically amplified resist material is applied on a substrate 1 so as to form a resist film 2 with a thickness of 0.20 μm.

Then, as shown in FIG. 9B, while supplying perfluoropolyether 3B onto the resist film 2, pattern exposure is carried out by irradiating the resist film 2 with exposing light 4 of $F_2$ laser with NA of 0.60 through a mask 5. Although a projection lens for projecting the exposing light 4 having passed through the mask 5 on the surface of the resist film 2 is not shown in FIG. 9B, a region sandwiched between the projection lens and the resist film 2 is filled with the perfluoropolyether 3B. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 9C, the resist film 2 is baked with a hot plate at a temperature of 100° C. for 60 seconds, and the resultant resist film is developed with a 2.38 wt % tetramethylammonium hydroxide developer (alkaline developer). In this manner, a resist pattern 6B made of the unexposed portion 2b of the resist film 2 can be obtained as shown in FIG. 9D.

As shown in FIGS. 8D and 9D, however, each of the resist patterns 6A and 6B formed by the first and second conventional pattern formation methods is in a defective T-top shape.

Since the positive chemically amplified resist material is used in each of the first and second conventional pattern formation methods, the resist pattern 6A or 6B is in the T-top shape. When a negative chemically amplified resist material is used instead, the resultant resist pattern is in a cross-section with round shoulders.

When a resist pattern in such a defective shape is used for etching a target film, the resultant pattern is also in a defective shape, which disadvantageously lowers the productivity and the yield in the fabrication process for semiconductor devices.

SUMMARY OF THE INVENTION

In consideration of the aforementioned conventional problem, an object of the invention is forming a resist pattern in a good shape by the immersion lithography.

In order to achieve the object, the first pattern formation method of this invention includes the steps of forming a resist film made from a chemically amplified resist material; performing pattern exposure by selectively irradiating the resist film with exposing light while supplying, onto the resist film, a solution that includes an acid generator for generating an acid through irradiation with light; and forming a resist pattern by developing the resist film after the pattern exposure.

In the first pattern formation method, the pattern exposure is performed with the acid generator supplied onto the resist film. Therefore, even when an acid generated from an acid generator included in the chemically amplified resist material diminishes in quantity because it flows into the solution or is deactivated due to the influence of the solution, the diminished quantity of the acid can be covered by an acid generated from the acid generator included in the solution. Accordingly, deactivation of the acid in an exposed portion of the resist film can be avoided, and hence, the resist pattern can be formed in a good shape. The acid generated from the acid generator included in the solution is also supplied to an unexposed portion of the resist film. However, when the quantity of the acid generated from the acid generator included in the solution is set to be lower than the threshold value of the quantity of the acid necessary for changing the solubility in a developer of the unexposed portion of the resist film, the acid supplied to the unexposed portion causes no problem.

The second pattern formation method of this invention includes the steps of forming a resist film made from a chemically amplified resist material; performing pattern exposure by selectively irradiating the resist film with exposing light while supplying, onto the resist film, a solution including an acid; and forming a resist pattern by developing the resist film after the pattern exposure.

In the second pattern formation method, the pattern exposure is performed with the acid supplied onto the resist film. Therefore, even when an acid generated from an acid generator included in the chemically amplified resist material diminishes in quantity because it flows into the solution or is deactivated due to the influence of the solution, the diminished quantity of the acid can be covered by the acid included in the solution. Accordingly, the deactivation of the acid in an exposed portion of the resist film can be avoided, and hence, the resist pattern can be formed in a good shape. The acid included in the solution is also supplied to an unexposed portion of the resist film. However, when the quantity of the acid included in the solution is set to be lower than the threshold value of the quantity of the acid necessary for changing the solubility in a developer of the unexposed portion of the resist film, the acid supplied to the unexposed portion causes no problem.

The third pattern formation method of this invention includes the steps of forming a resist film made from a chemically amplified resist material; forming, on the resist film, a water-soluble film including an acid generator for generating an acid through irradiation with light; performing pattern exposure by selectively irradiating the resist film with exposing light while supplying a nonaqueous solution onto the water-soluble film; and forming a resist pattern by developing the resist film after the pattern exposure.

In the third pattern formation method, the water-soluble film including the acid generator is formed on the resist film. Therefore, even when an acid generated from an acid generator included in the chemically amplified resist material diminishes in quantity because it flows into the nonaqueous solution or is deactivated due to the influence of the nonaqueous solution, the diminished quantity of the acid can be covered by an acid generated from the acid generator included in the water-soluble film. Accordingly, the deactivation of the acid in an exposed portion of the resist film can be avoided, and hence, the resist pattern can be formed in a good shape. In the third pattern formation method, the acid generated from the acid generator included in the water-soluble film is supplied substantially merely to an exposed portion of the resist film, and therefore, a problem that an unwanted acid is supplied to an unexposed portion of the resist film can be substantially avoided. Also, although the water-soluble film is formed on the resist film in the third pattern formation method, the water-soluble film is never dissolved because the immersion lithography is performed by using the nonaqueous solution.

The fourth pattern formation method of this invention includes the steps of forming a resist film made from a chemically amplified resist material; forming, on the resist film, a water-soluble film including an acid; performing pattern exposure by selectively irradiating the resist film with exposing light while supplying a nonaqueous solution onto the water-soluble film; and forming a resist pattern by developing the resist film after the pattern exposure.

In the fourth pattern formation method, the water-soluble film including the acid is formed on the resist film. Therefore, even when an acid generated from an acid generator included in the chemically amplified resist material diminishes in quantity because it flows into the nonaqueous solution or is deactivated due to the influence of the nonaqueous solution, the diminished quantity of the acid can be covered by the acid included in the water-soluble film. Accordingly, the deactivation of the acid in an exposed portion of the resist film can be avoided, and hence, the resist pattern can be formed in a good shape. The acid included in the water-soluble film is also supplied to an unexposed portion of the resist film. However, when the quantity of the acid included in the water-soluble film is set to be lower than the threshold value of the quantity of the acid necessary for changing the solubility in a developer of the unexposed portion of the resist film, the acid supplied to the unexposed portion causes no problem. Also, although the water-soluble film is formed on the resist film in the fourth pattern formation method, the water-soluble film is never dissolved because the immersion lithography is performed by using the nonaqueous solution.

The fifth pattern formation method of this invention includes the steps of forming a resist film made from a chemically amplified resist material; forming, on the resist film, a water-soluble film including an acid polymer; performing pattern exposure by selectively irradiating the resist film with exposing light while supplying a nonaqueous solution onto the water-soluble film; and forming a resist pattern by developing the resist film after the pattern exposure.

In the fifth pattern formation method, the water-soluble film including the acid polymer is formed on the resist film. Therefore, even when an acid generated from an acid generator included in the chemically amplified resist material diminishes in quantity because it flows into the nonaqueous solution or is deactivated due to the influence of the nonaqueous solution, the diminished quantity of the acid can be covered by an acid generated from the acid polymer included in the water-soluble film. Accordingly, the deactivation of the acid in an exposed portion of the resist film can be avoided, and hence, the resist pattern can be formed in a good shape. The acid polymer included in the water-soluble film is also supplied to an unexposed portion of the resist film. However, when the quantity of the acid polymer included in the water-soluble film is set to be lower than the threshold value of the quantity of the acid necessary for changing the solubility in a developer of the unexposed portion of the resist film, the acid supplied to the unexposed portion causes no problem. Also, although the water-soluble film is formed on the resist film in the fifth pattern formation method, the water-soluble film is never dissolved because the immersion lithography is performed by using the non-aqueous solution.

In the first or second pattern formation method, the solution supplied onto the resist film is preferably water.

When water having a high refractive index is used as the solution, a value n·NA can be definitely large.

In the first or second pattern formation method, the solution supplied onto the resist film is preferably perfluoropolyether.

When perfluoropolyether is used as the solution, even when a water-soluble film is formed on the resist film, the water-soluble film can be prevented from being dissolved in the solution.

In the third, fourth or fifth pattern formation method, the nonaqueous solution supplied onto the resist film can be perfluoropolyether.

In the first or third pattern formation method, the acid generator can be an onium salt.

In the second or fourth pattern formation method, the acid can be acetic acid.

In the third or fourth pattern formation method, the water-soluble film can be a polyvinyl alcohol film or a polyvinyl pyrrolidone film.

In the fifth pattern formation method, the acid polymer can be polyacrylic acid or polystyrene sulfonic acid.

DETAILED DESCRIPTION OF THE INVENTION

Pattern formation methods according to preferred embodiments of the invention will now be described, and first of all, an exposure system used in each embodiment will be described with reference to FIG. 1.

Figure 1:
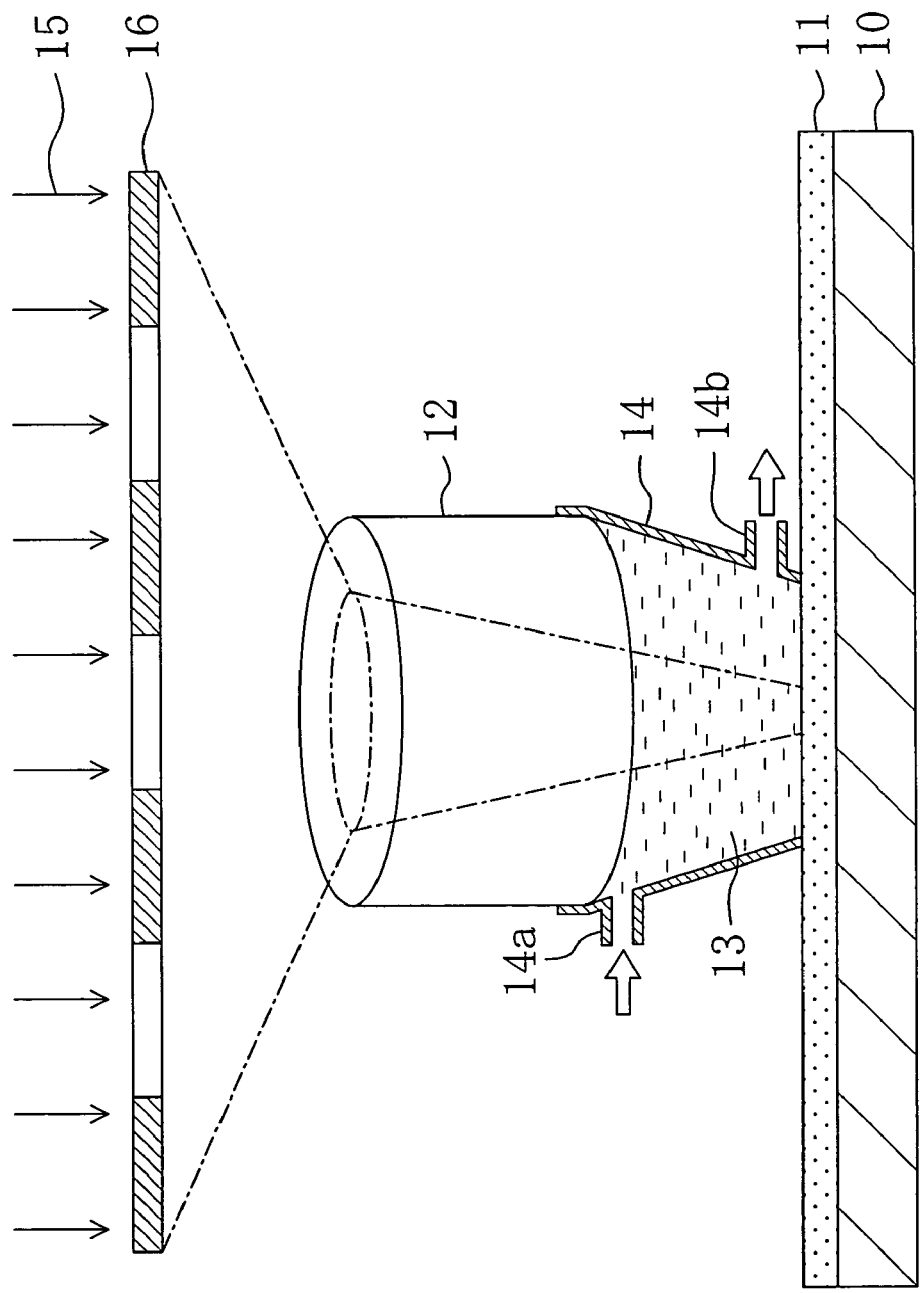
FIG. 1 is a partial cross-sectional view of an exposure system commonly used in preferred embodiments of the invention.

As shown in FIG. 1, a projection lens 12 of the exposure system is provided above a resist film 11 formed on a semiconductor substrate 10, and a solution storage 14 for storing a solution 13 (with a refractive index n) is provided between the projection lens 12 and the resist film 11. The solution storage 14 is provided with an inlet 14a for allowing the solution 13 to flow into and an outlet 14b for allowing the solution 13 to flow out of the solution storage 14, and the solution 13 having flown into the solution storage 14 through the inlet 14a is temporarily stored in the solution storage 14 and then flows out through the outlet 14b. Accordingly, exposing light 15 passes through a mask 16 having a desired pattern, is then projected by the projection lens 12 so as to reach the surface of the resist film 11 through the solution 13. Therefore, the numerical aperture NA of the exposing light that reaches the surface of the resist film 11 through the solution 13 has a value n times as large as that attained when the exposing light reaches without passing through the solution 13.

Embodiment 1

A pattern formation method according to Embodiment 1 of the invention will now be described with reference to FIGS. 2A through 2D.

Figure 2A:
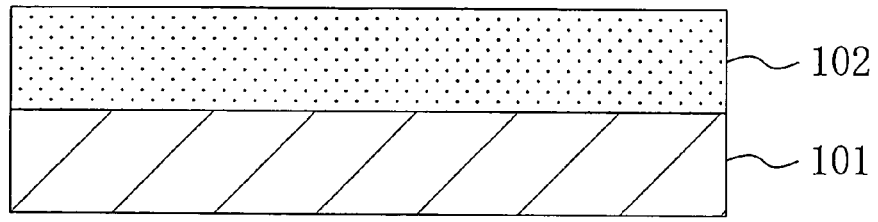
FIGS. 2A, 2B, 2C and 2D are cross-sectional views for showing procedures in a pattern formation method according to Embodiment 1 of the invention.

First, a positive chemically amplified resist material having the following composition is prepared:

Base polymer: poly((norbornene-5-methylene-t-butylcarboxylate)—(maleic anhydride))(wherein norbornene-5-methylene-t-butylcarboxylate:maleic anhydride=50 mol %:50 mol %) . . . 2 g Acid generator: trifluorosulfonium triflate . . . 0.06 g Solvent: propylene glycol monomethyl ether acetate . . . 20 g Next, as shown in FIG. 2A, the aforementioned chemically amplified resist material is applied on a substrate 101 so as to form a resist film 102 with a thickness of 0.35 $\mu$m.

Figure 2B:
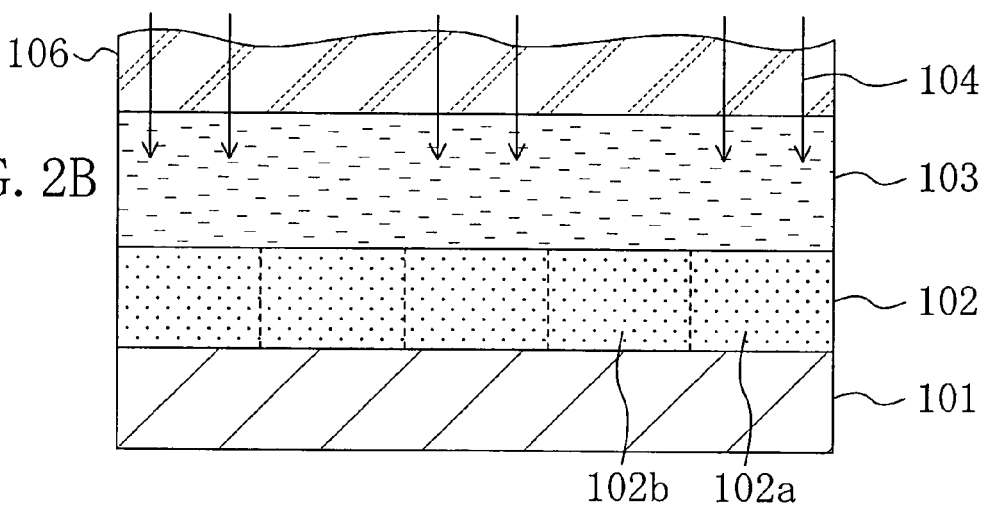

Then, as shown in FIG. 2B, while supplying, between a projection lens 106 and the resist film 102, water 103 (having a refractive index n of 1.44) that includes 3 wt % of triphenylsulfonium nonaflate (an onium salt), that is, an acid generator, and is circulated and temporarily stored in the solution storage 14 (shown in FIG. 1), pattern exposure is carried out by irradiating the resist film 102 with exposing light 104 of ArF excimer laser with NA of 0.65 through a mask not shown. Thus, an exposed portion 102a of the resist film 102 becomes soluble in an alkaline developer because an acid is generated from the acid generator therein while an unexposed portion 102b of the resist film 102 remains insoluble in an alkaline developer because no acid is generated from the acid generator therein.

Figure 2C:
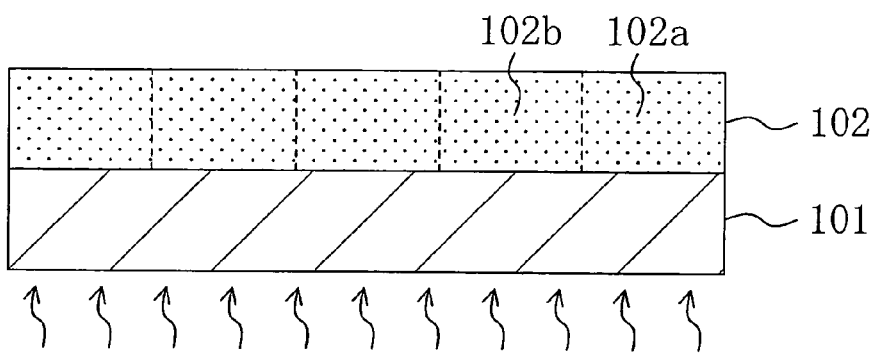
Figure 2D:
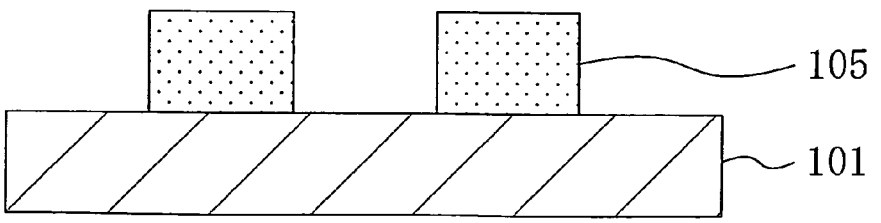

After the pattern exposure, as shown in FIG. 2C, the resist film 102 is baked with a hot plate at a temperature of 110° C. for 60 seconds, and the resultant resist film is developed with a 2.38 wt % tetramethylammonium hydroxide developer (alkaline developer). In this manner, a resist pattern 105 made of the unexposed portion 102b of the resist film 102 and having a line width of 0.09 $\mu$m can be formed in a good shape as shown in FIG. 2D.

In Embodiment 1, since the pattern exposure is carried out while supplying the water 103 that includes the acid generator onto the resist film 102, even when the acid generated from the acid generator in the exposed portion 102a of the resist film 102 flows into the water 103 and diminishes in quantity, the diminished quantity of the acid is covered by an acid generated from the acid generator included in the water 103. Therefore, deactivation of the acid in the exposed portion 102a of the resist film 102 can be avoided, so that the resist pattern 105 can be formed in a good shape.

Although the acid generated from the acid generator included in the water 103 is also supplied to the unexposed portion 102b of the resist film 102, the quantity of the acid generator included in the water 103 is small, and therefore, the unexposed portion 102b of the resist film 102 remains insoluble in an alkaline developer.

Although the acid generator is included in the water 103 in Embodiment 1, approximately 3 wt % of acetic acid may be included instead in the water 103 as an acid. In this case, although the acetic acid included in the water 103 is also supplied to the unexposed portion 102b of the resist film 102, the quantity of acetic acid included in the water 103 is small, and therefore, the unexposed portion 102b of the resist film 102 remains insoluble in an alkaline developer.

Alternatively, the acid included in the water 103 may be acrylic acid, formic acid or the like instead of acetic acid.

Embodiment 2

A pattern formation method according to Embodiment 2 of the invention will now be described with reference to FIGS. 3A through 3D.

Figure 3A:
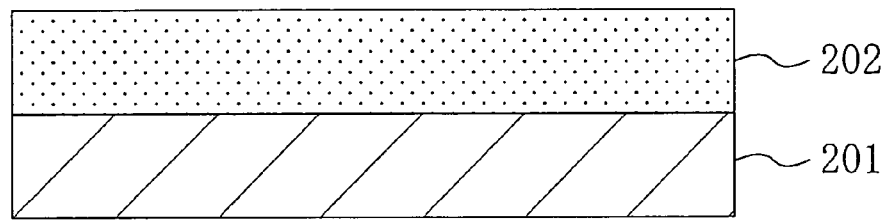
FIGS. 3A, 3B, 3C and 3D are cross-sectional views for showing procedures in a pattern formation method according to Embodiment 2 of the invention.

First, a negative chemically amplified resist material having the following composition is prepared:

Base polymer: poly((norbornene-5-methylenecarboxylate)—(maleic anhydride))(wherein norbornene-5-methylenecarboxylate:maleic anhydride=50 mol %:50 mol %) . . . 2 g Crosslinking agent: 1,3,5-N-(trihydroxymethyl)melamine . . . 0.7 g Acid generator: trifluorosulfonium triflate . . . 0.06 g Solvent: propylene glycol monomethyl ether acetate . . . 20 g Next, as shown in FIG. 3A, the aforementioned chemically amplified resist material is applied on a substrate 201 so as to form a resist film 202 with a thickness of 0.35 $\mu$m.

Figure 3B:
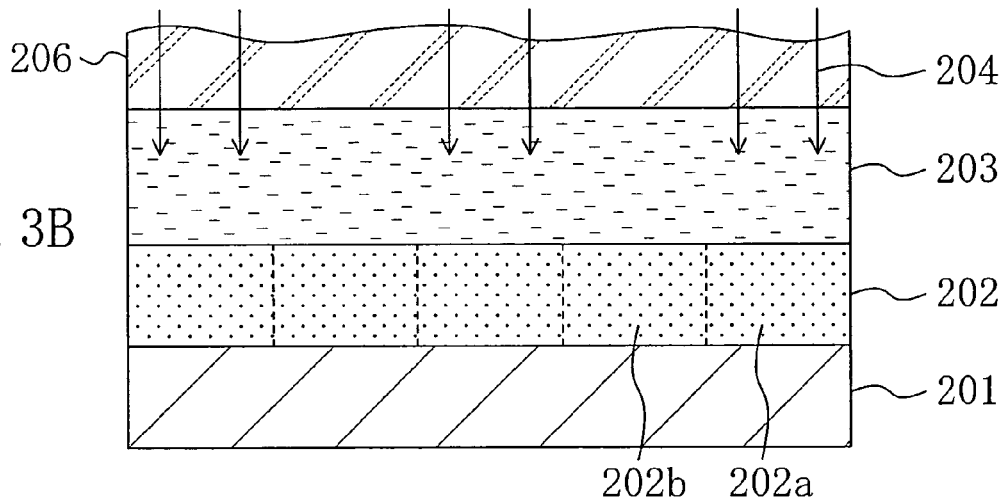

Then, as shown in FIG. 3B, while supplying, between a projection lens 206 and the resist film 202, water 203 that includes 3 wt % of triphenylsulfonium nonaflate (an onium salt), that is, an acid generator, and is circulated and temporarily stored in the solution storage 14 (shown in FIG. 1), pattern exposure is carried out by irradiating the resist film 202 with exposing light 204 of ArF excimer laser with NA of 0.65 through a mask not shown. Thus, an exposed portion 202a of the resist film 202 becomes insoluble in an alkaline developer due to the function of the crosslinking agent because an acid is generated from the acid generator therein while an unexposed portion 202b of the resist film 202 remains soluble in an alkaline developer because no acid is generated from the acid generator therein.

Figure 3C:
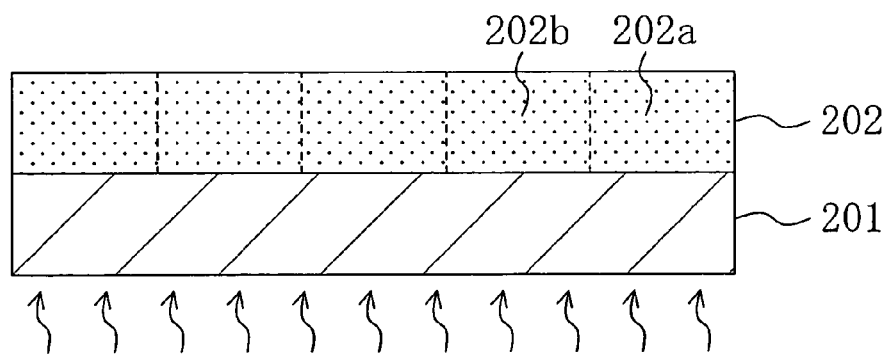
Figure 3D:
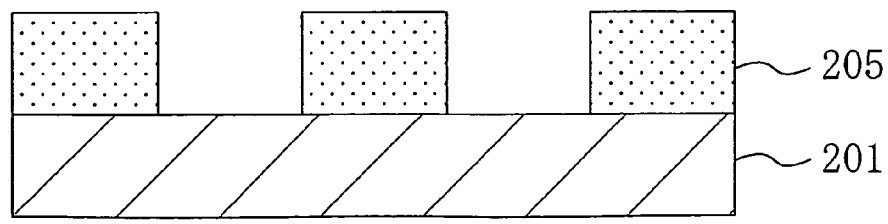

After the pattern exposure, as shown in FIG. 3C, the resist film 202 is baked with a hot plate at a temperature of 120° C. for 90 seconds, and the resultant resist film is developed with a 2.38 wt % tetramethylammonium hydroxide developer (alkaline developer). In this manner, a resist pattern 205 made of the exposed portion 202a of the resist film 202 and having a line width of 0.09 $\mu$m can be formed in a good shape as shown in FIG. 3D.

In Embodiment 2, since the pattern exposure is carried out while supplying the water 203 that includes the acid generator onto the resist film 202, even when the acid generated from the acid generator in the exposed portion 202a of the resist film 202 flows into the water 203 and diminishes in quantity, the diminished quantity of the acid is covered by an acid generated from the acid generator included in the water 203. Therefore, deactivation of the acid in the exposed portion 202a of the resist film 202 can be avoided, so that the resist pattern 205 can be formed in a good shape.

Although the acid generated from the acid generator included in the water 203 is also supplied to the unexposed portion 202b of the resist film 202, the quantity of the acid generator included in the water 203 is small, and therefore, the unexposed portion 202b of the resist film 202 remains soluble in an alkaline developer.

Although the acid generator is included in the water 203 in Embodiment 2, approximately 3 wt % of acetic acid may be included instead in the water 203 as an acid. In this case, although the acetic acid included in the water 203 is also supplied to the unexposed portion 202b of the resist film 202, the quantity of the acetic acid included in the water 203 is small, and therefore, the unexposed portion 202b of the resist film 202 remains soluble in an alkaline developer.

Alternatively, the acid included in the water 203 may be acrylic acid, formic acid or the like instead of acetic acid.

Embodiment 3

A pattern formation method according to Embodiment 3 of the invention will now be described with reference to FIGS. 4A through 4D.

Figure 4A:
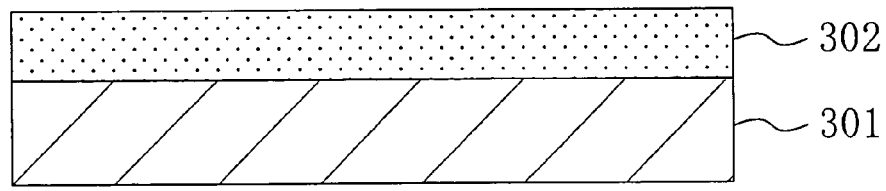
FIGS. 4A, 4B, 4C and 4D are cross-sectional views for showing procedures in a pattern formation method according to Embodiment 3 of the invention.

First, a positive chemically amplified resist material having the following composition is prepared:

Base polymer: poly((norbornene-5-methylene-t-butylcarboxylate)—(maleic anhydride))(wherein norbornene-5-methylene-t-butylcarboxylate:maleic anhydride=50 mol %:50 mol %) . . . 2 g Acid generator: trifluorosulfonium triflate . . . 0.06 g Solvent: propylene glycol monomethyl ether acetate . . . 20 g Next, as shown in FIG. 4A, the aforementioned chemically amplified resist material is applied on a substrate 301 so as to form a resist film 302 with a thickness of 0.20 $\mu$m.

Figure 4B:
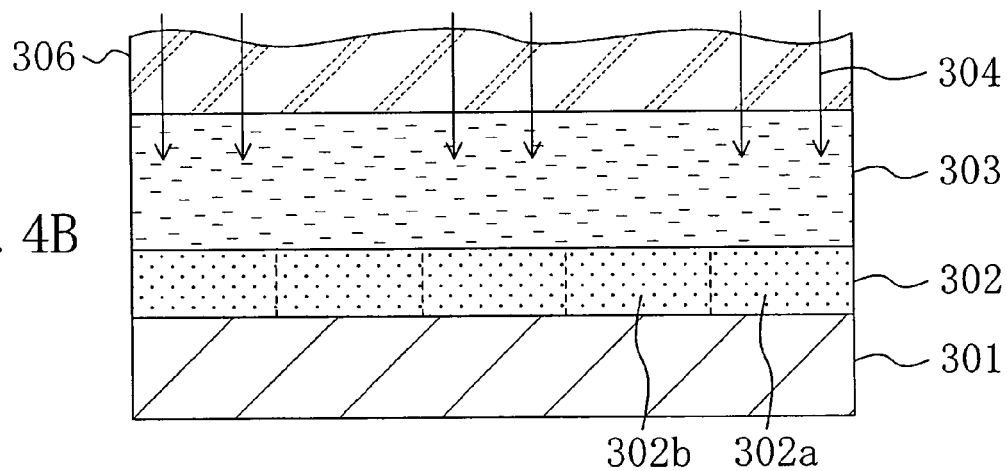

Then, as shown in FIG. 4B, while supplying, between a projection lens 306 and the resist film 302, a nonaqueous solution 303 of perfluoropolyether (having a refractive index of 1.37) that is represented by Chemical Formula 1, includes 5 wt % of triphenylsulfonium nonaflate (an onium salt), that is, an acid generator, and is circulated and temporarily stored in the solution storage 14 (shown in FIG. 1), pattern exposure is carried out by irradiating the resist film 302 with exposing light 304 of $F_2$ laser with NA of 0.60 through a mask not shown. Thus, an exposed portion 302a of the resist film 302 becomes soluble in an alkaline developer because an acid is generated from the acid generator therein while an unexposed portion 302b of the resist film 302 remains insoluble in an alkaline developer because no acid is generated from the acid generator therein.

Chemical Formula 1:

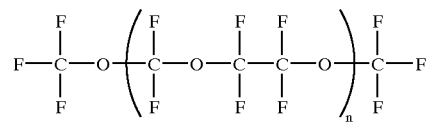

Figure 4C:
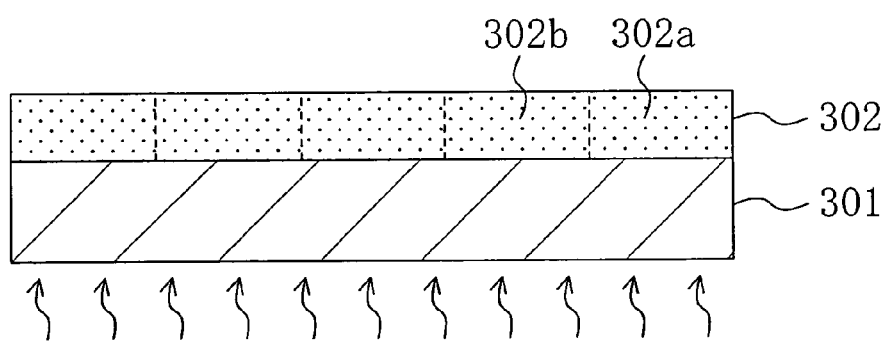
Figure 4D:
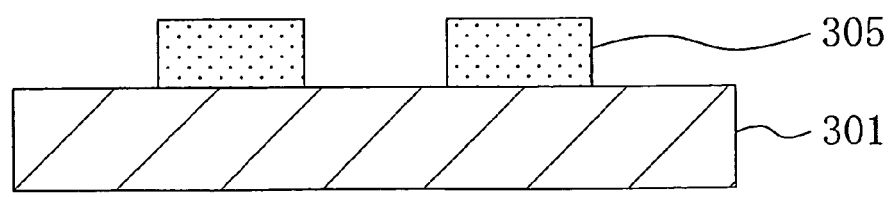

After the pattern exposure, as shown in FIG. 4C, the resist film 302 is baked with a hot plate at a temperature of 100° C. for 60 seconds, and the resultant resist film is developed with a 2.38 wt % tetramethylammonium hydroxide developer (alkaline developer). In this manner, a resist pattern 305 made of the unexposed portion 302b of the resist film 302 and having a line width of 0.06 $\mu$m can be formed in a good shape as shown in FIG. 4D.

In Embodiment 3, since the pattern exposure is carried out while supplying the nonaqueous solution 303 that includes the acid generator onto the resist film 302, even when the acid generated from the acid generator in the exposed portion 302a of the resist film 302 flows into the nonaqueous solution 303 and diminishes in quantity, the diminished quantity of the acid is covered by an acid generated from the acid generator included in the nonaqueous solution 303. Therefore, deactivation of the acid in the exposed portion 302a of the resist film 302 can be avoided, so that the resist pattern 305 can be formed in a good shape.

Although the acid generated from the acid generator included in the nonaqueous solution 303 is also supplied to the unexposed portion 302b of the resist film 302, the quantity of the acid generator included in the nonaqueous solution 303 is small, and therefore, the unexposed portion 302b of the resist film 302 remains insoluble in an alkaline developer.

Although the acid generator included in the nonaqueous solution 303 is triphenylsulfonium nonaflate in Embodiment 3, the acid generator may be a sulfone compound such as bis(phenylsulfonyl)methane; a sulfonate compound such as 2,6-dinitrobenzyltosylate or pyrogallol trimesylate; or a sulfonimide compound such as N-(trifluoromethylsulfonyloxy)succinimide, N-(trifluoromethylsulfonyloxy)phthalimide or N-(trifluoromethylsulfonyloxy)diphenylmaleimide instead.

Although the acid generator is included in the nonaqueous solution 303 in Embodiment 3, approximately 8 wt % of acetic acid may be included instead in the nonaqueous solution 303 as an acid. In this case, although the acetic acid included in the nonaqueous solution 303 is also supplied to the unexposed portion 302b of the resist film 302, the quantity of the acetic acid included in the nonaqueous solution 303 is small, and therefore, the unexposed portion 302b of the resist film 302 remains insoluble in an alkaline developer.

Alternatively, the acid included in the nonaqueous solution 303 may be acrylic acid, formic acid or the like instead of acetic acid.

Embodiment 4

A pattern formation method according to Embodiment 4 of the invention will now be described with reference to FIGS. 5A through 5D.

Figure 5A:
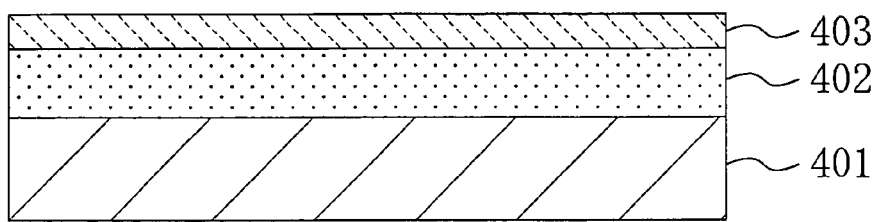
FIGS. 5A, 5B, 5C and 5D are cross-sectional views for showing procedures in a pattern formation method according to Embodiment 4 of the invention.

First, a positive chemically amplified resist material having the following composition is prepared:

Base polymer: poly((norbornene-5-methylene-t-butylcarboxylate)—(maleic anhydride))(wherein norbornene-5-methylene-t-butylcarboxylate:maleic anhydride=50 mol %:50 mol %) . . . 2 g Acid generator: trifluorosulfonium triflate . . . 0.06 g Solvent: propylene glycol monomethyl ether acetate . . . 20 g Next, as shown in FIG. 5A, the aforementioned chemically amplified resist material is applied on a substrate 401 so as to form a resist film 402 with a thickness of 0.20 µm. Thereafter, a water-soluble film 403 made of a polyvinyl alcohol film including 5 wt % of triphenylsulfonium triflate, that is, an acid generator, is formed on the resist film 402.

Figure 5B:
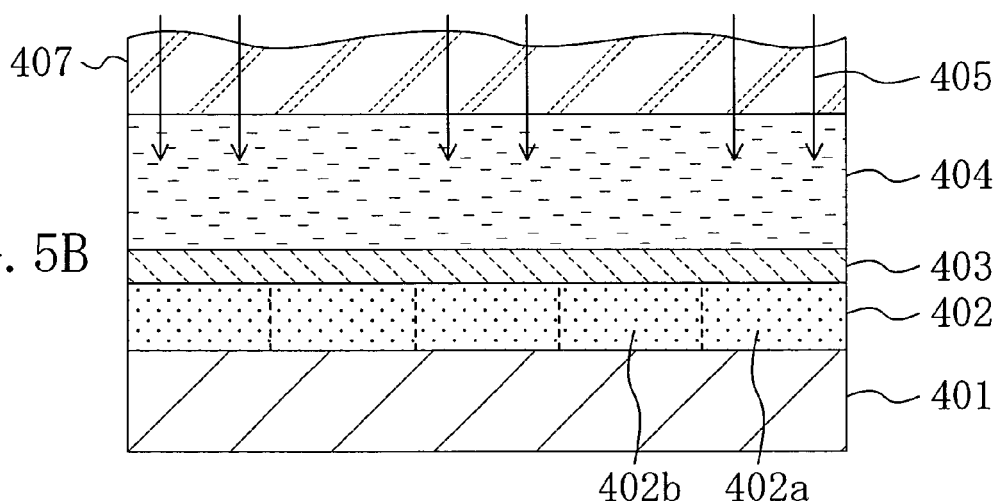

Then, as shown in FIG. 5B, while supplying, between a projection lens 407 and the water-soluble film 403, a nonaqueous solution 404 of perfluoropolyether that is circulated and temporarily stored in the solution storage 14 (shown in FIG. 1), pattern exposure is carried out by irradiating the resist film 402 and the water-soluble film 403 with exposing light 405 of $F_2$ laser with NA of 0.60 through a mask not shown. Thus, an exposed portion 402a of the resist film 402 becomes soluble in an alkaline developer because an acid is generated from the acid generator therein while an unexposed portion 402b of the resist film 402 remains insoluble in an alkaline developer because no acid is generated from the acid generator therein.

Figure 5C:
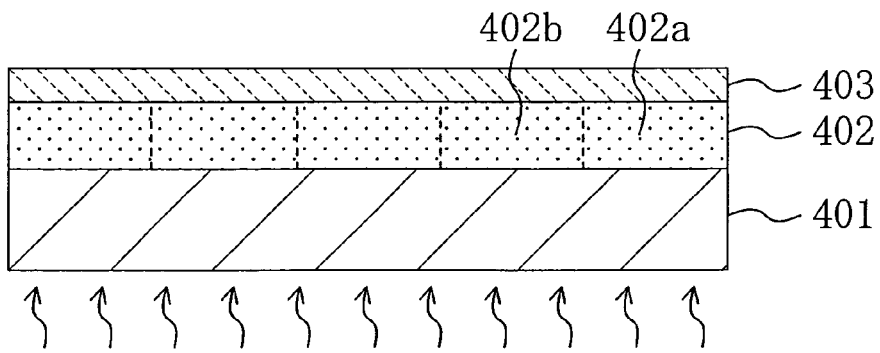
Figure 5D:
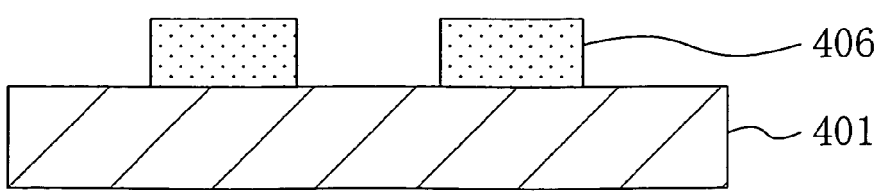

After the pattern exposure, as shown in FIG. 5C, the resist film 402 is baked with a hot plate at a temperature of 100° C. for 60 seconds, and the resultant resist film is developed with a 2.38 wt % tetramethylammonium hydroxide developer (alkaline developer). Thus, the water-soluble film 403 and the exposed portion 402a of the resist film 402 are dissolved in the alkaline developer. In this manner, a resist pattern 406 made of the unexposed portion 402b of the resist film 402 and having a line width of 0.09 µm can be formed in a good shape as shown in FIG. 5D.

In Embodiment 4, since the pattern exposure is carried out after forming the water-soluble film 403 including the acid generator on the resist film 402, even when the acid generated from the acid generator in the exposed portion 402a of the resist film 402 flows into the nonaqueous solution 404 and diminishes in quantity, the diminished quantity of the acid is covered by an acid generated from the acid generator included in the water-soluble film 403. Therefore, deactivation of the acid in the exposed portion 402a of the resist film 402 can be avoided, so that the resist pattern 406 can be formed in a good shape. In this case, the acid generated from the acid generator included in the water-soluble film 403 is supplied substantially merely to the exposed portion 402a of the resist film 402, and therefore, a problem that an unwanted acid is supplied to the unexposed portion 402b of the resist film 402 can be substantially avoided.

Although the water-soluble film 403 is formed on the resist film 402 in Embodiment 4, the water-soluble film 403 is never dissolved because the immersion lithography is carried out by using the nonaqueous solution 404.

Although the acid generator included in the nonaqueous solution 403 is triphenylsulfonium nonaflate in Embodiment 4, the acid generator may be a sulfone compound such as bis(phenylsulfonyl)methane; a sulfonate compound such as 2,6-dinitrobenzyltosylate or pyrogallol trimesylate; or a sulfonimide compound such as N-(trifluoromethylsulfonyloxy)succinimide, N-(trifluoromethylsulfonyloxy)phthalimide or N-(trifluoromethylsulfonyloxy)diphenylmaleimide instead.

Furthermore, although the water-soluble film 403 is removed by using the alkaline developer in Embodiment 4, the water-soluble film 403 may be removed by using water before or after baking the resist film 402.

Although the water-soluble film 403 is made of a polyvinyl alcohol film in Embodiment 4, it may be made of a polyvinyl pyrrolidone film instead.

Although the acid generator is included in the water-soluble film 403 in Embodiment 4, acetic acid, acrylic acid or formic acid may be included instead in the water-soluble film 403. In such a case, the content of the acid may be several wt %.

Embodiment 5

A pattern formation method according to Embodiment 5 of the invention will now be described with reference to FIGS. 6A through 6D.

Figure 6A:
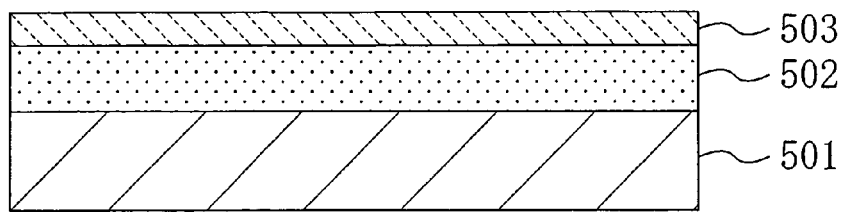
FIGS. 6A, 6B, 6C and 6D are cross-sectional views for showing procedures in a pattern formation method according to Embodiment 5 of the invention.

First, a negative chemically amplified resist material having the following composition is prepared:

Base polymer: poly((norbornene-5-methylenecarboxylate)—(maleic anhydride))(wherein norbornene-5-methylenecarboxylate:maleic anhydride=50 mol % :50 mol %) . . . 2 g Crosslinking agent: 1,3,5-N-(trihydroxymethyl)melamine . . . 0.7 g Acid generator: trifluorosulfonium triflate . . . 0.06 g Solvent: propylene glycol monomethyl ether acetate . . . 20 g Next, as shown in FIG. 6A, the aforementioned chemically amplified resist material is applied on a substrate 501 so as to form a resist film 502 with a thickness of 0.20 µm. Thereafter, a water-soluble film 503 made of a polyvinyl alcohol film including 5 wt % of triphenylsulfonium triflate, that is, an acid generator, is formed on the resist film 502.

Figure 6B:
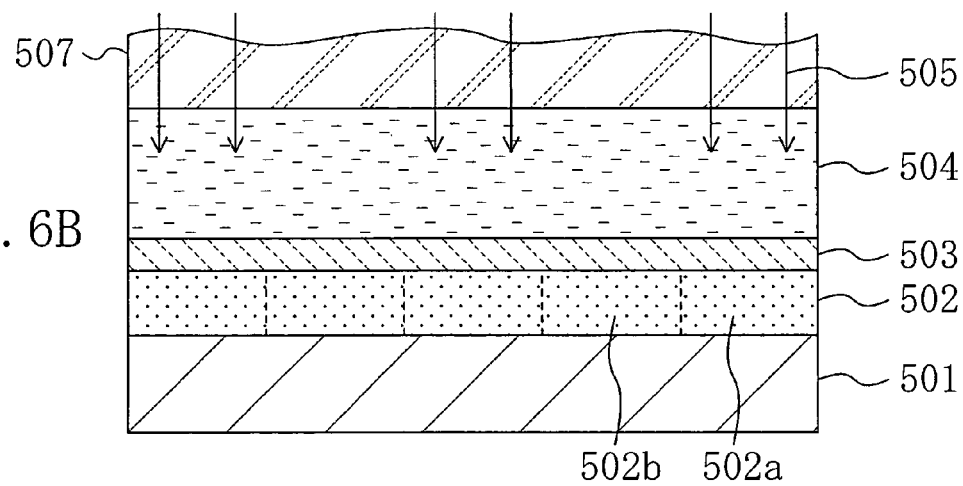

Then, as shown in FIG. 6B, while supplying, between a projection lens 507 and the water-soluble film 503, a nonaqueous solution 504 of perfluoropolyether that is circulated and temporarily stored in the solution storage 14 (shown in FIG. 1), pattern exposure is carried out by irradiating the resist film 502 and the water-soluble film 503 with exposing light 505 of $F_2$ laser with NA of 0.60 through a mask not shown. Thus, an exposed portion 502a of the resist film 502 becomes insoluble in an alkaline developer due to the function of the crosslinking agent because an acid is generated from the acid generator therein while an unexposed portion 502b of the resist film 502 remains soluble in an alkaline developer because no acid is generated from the acid generator therein.

Figure 6C:
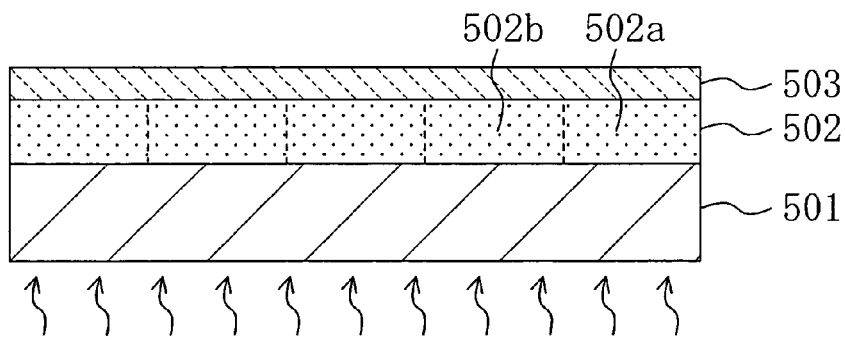
Figure 6D:
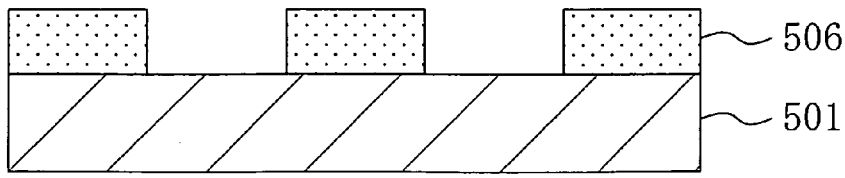

After the pattern exposure, as shown in FIG. 6C, the resist film 502 is baked with a hot plate at a temperature of 120° C. for 60 seconds, and the resultant resist film is developed with a 2.38 wt % tetramethylammonium hydroxide developer (alkaline developer). Thus, the water-soluble film 503 and the unexposed portion 502b of the resist film 502 are dissolved in the alkaline developer. In this manner, a resist pattern 506 made of the exposed portion 502a of the resist film 502 and having a line width of 0.09 µm can be formed in a good shape as shown in FIG. 6D.

In Embodiment 5, since the pattern exposure is carried out after forming the water-soluble film 503 including the acid generator on the resist film 502, even when the acid generated from the acid generator in the exposed portion 502a of the resist film 502 flows into the nonaqueous solution 504 and diminishes in quantity, the diminished quantity of the acid is covered by an acid generated from the acid generator included in the water-soluble film 503. Therefore, deactivation of the acid in the exposed portion 502a of the resist film 502 can be avoided, so that the resist pattern 506 can be formed in a good shape. In this case, the acid generated from the acid generator included in the water-soluble film 503 is supplied substantially merely to the exposed portion 502a of the resist film 502, and therefore, a problem that an unwanted acid is supplied to the unexposed portion 502b of the resist film 502 can be substantially avoided.

Although the water-soluble film 503 is formed on the resist film 502 in Embodiment 5, the water-soluble film 503 is never dissolved because the immersion lithography is carried out by using the nonaqueous solution 504.

Furthermore, although the water-soluble film 503 is removed by using the alkaline developer in Embodiment 5, the water-soluble film 503 may be removed by using water before or after baking the resist film 502.

Although the water-soluble film 503 is made of a polyvinyl alcohol film in Embodiment 5, it may be made of a polyvinyl pyrrolidone film instead.

Although the acid generator is included in the water-soluble film 503 in Embodiment 5, acetic acid, acrylic acid or formic acid may be included instead in the water-soluble film 503. In such a case, the content of the acid may be several wt %.

Embodiment 6

A pattern formation method according to Embodiment 6 of the invention will now be described with reference to FIGS. 7A through 7D.

Figure 7A:
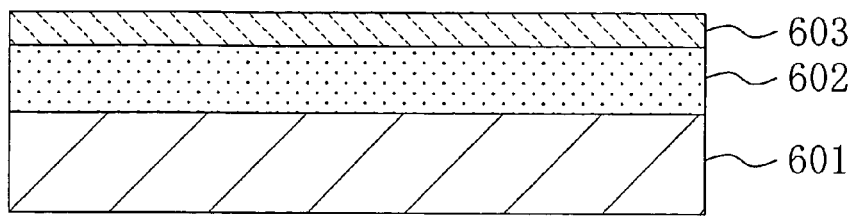
FIGS. 7A, 7B, 7C and 7D are cross-sectional views for showing procedures in a pattern formation method according to Embodiment 6 of the invention.

First, a positive chemically amplified resist material having the following composition is prepared:

Base polymer: poly((norbornene-5-methylene-t-butylcarboxylate)—(maleic anhydride))(wherein norbornene-5-methylene-t-butylcarboxylate:maleic anhydride=50 mol %:50 mol %) . . . 2 g Acid generator: trifluorosulfonium triflate . . . 0.06 g Solvent: propylene glycol monomethyl ether acetate . . . 20 g Next, as shown in FIG. 7A, the aforementioned chemically amplified resist material is applied on a substrate 601 so as to form a resist film 602 with a thickness of 0.20 µm. Thereafter, a water-soluble film 603 including an acid polymer of polyacrylic acid is formed on the resist film 602.

Figure 7B:
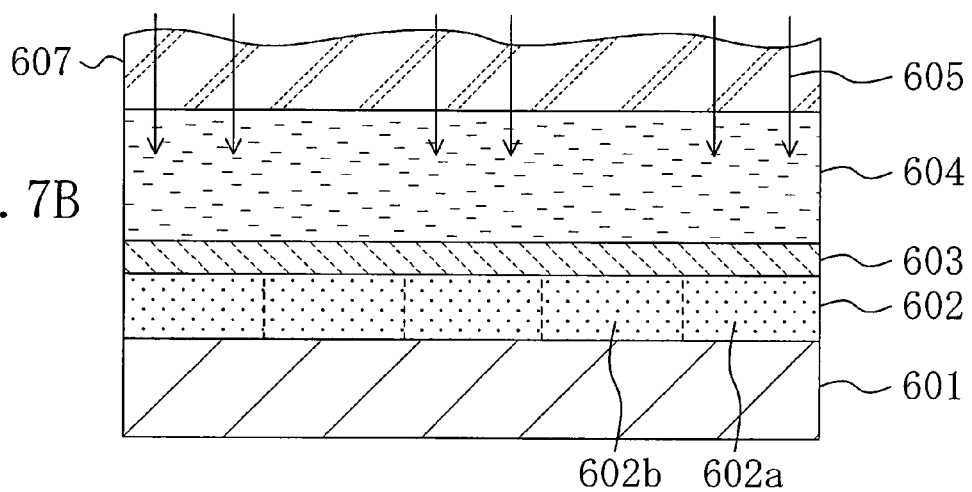

Then, as shown in FIG. 7B, while supplying, between a projection lens 607 and the water-soluble film 603, a nonaqueous solution 604 of perfluoropolyether that is circulated and temporarily stored in the solution storage 14 (shown in FIG. 1), pattern exposure is carried out by irradiating the resist film 602 and the water-soluble film 603 with exposing light 605 of $F_2$ laser with NA of 0.60 through a mask not shown. Thus, an exposed portion 602a of the resist film 602 becomes soluble in an alkaline developer because an acid is generated from the acid generator therein while an unexposed portion 602b of the resist film 602 remains insoluble in an alkaline developer because no acid is generated from the acid generator therein.

Figure 7C:
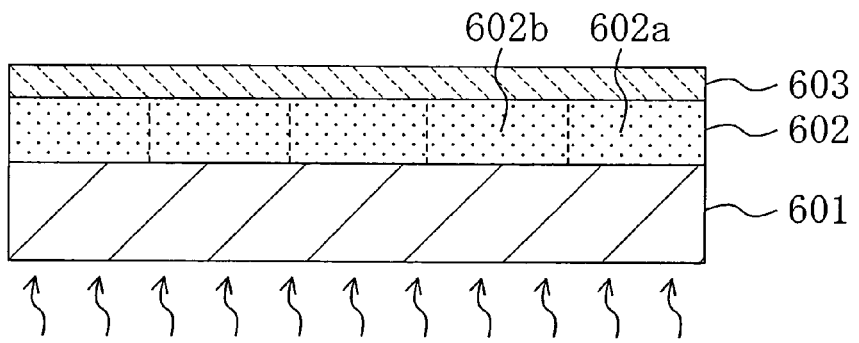
Figure 7D:
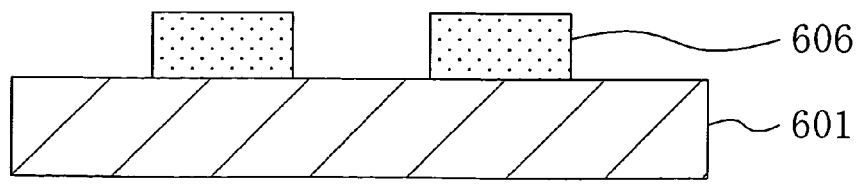
Figure 8A:
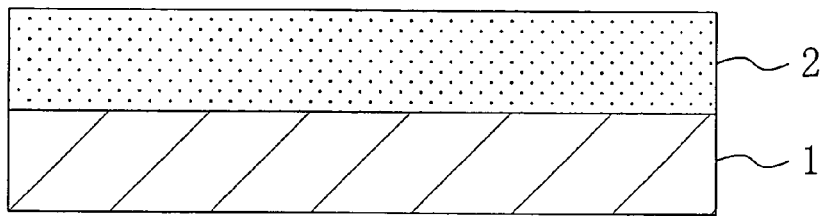
FIGS. 8A, 8B, 8C and 8D are cross-sectional views for showing procedures in a first conventional pattern formation method.
Figure 8B:
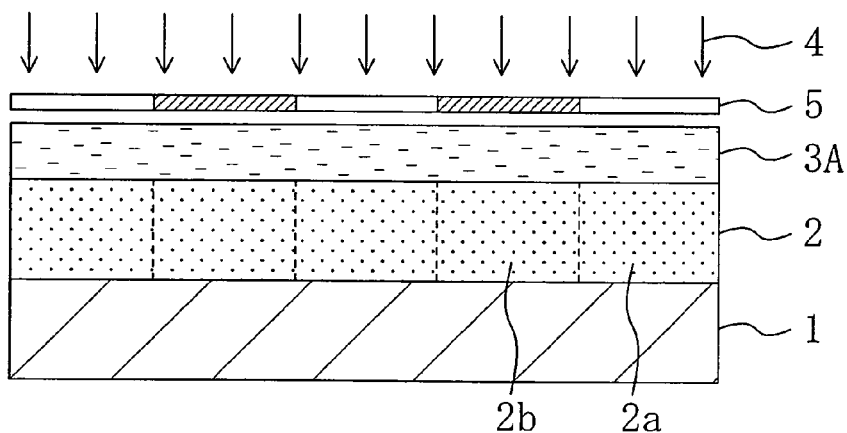
Figure 8C:
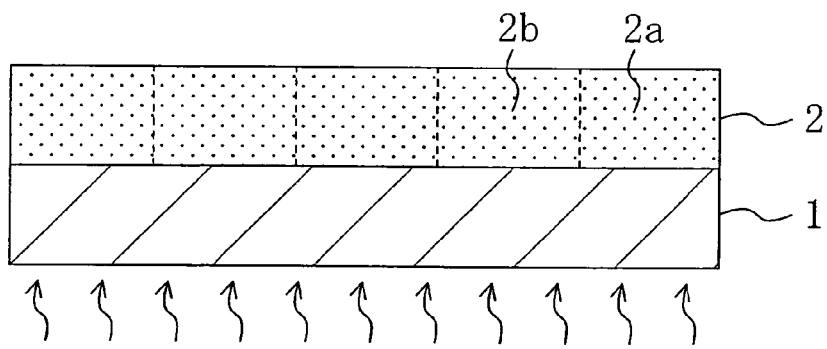
Figure 8D:
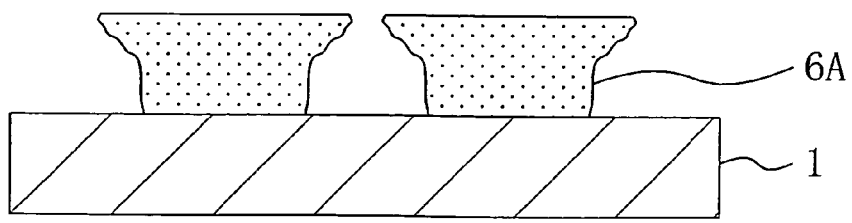
Figure 9A:
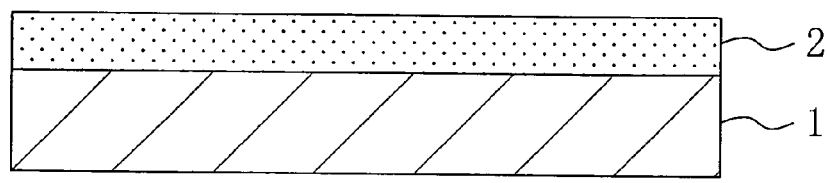
FIGS. 9A, 9B, 9C and 9D are cross-sectional views for showing procedures in a second conventional pattern formation method.
Figure 9B:
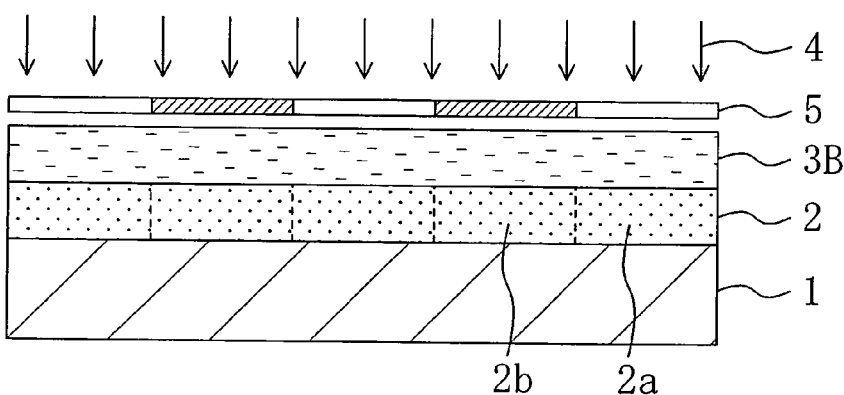
Figure 9C:
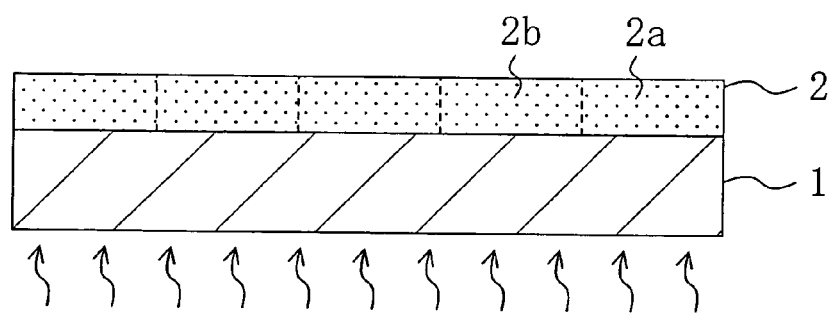
Figure 9D:
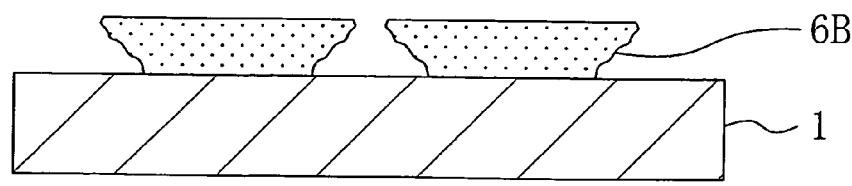

After the pattern exposure, as shown in FIG. 7C, the resist film 602 is baked with a hot plate at a temperature of 100° C. for 60 seconds, and the resultant resist film is developed with a 2.38 wt % tetramethylammonium hydroxide developer (alkaline developer). Thus, the water-soluble film 603 and the exposed portion 602a of the resist film 602 are dissolved in the alkaline developer. In this manner, a resist pattern 606 made of the unexposed portion 602b of the resist film 602 and having a line width of 0.09 µm can be formed in a good shape as shown in FIG. 7D.

In Embodiment 6, since the pattern exposure is carried out after forming the water-soluble film 603 including the acid polymer on the resist film 602, even when the acid generated from the acid generator in the exposed portion 602a of the resist film 602 flows into the nonaqueous solution 604 and diminishes in quantity, the diminished quantity of the acid is covered by an acid generated from the acid polymer included in the water-soluble film 603. Therefore, deactivation of the acid in the exposed portion 602a of the resist film 602 can be avoided, so that the resist pattern 606 can be formed in a good shape.

In this case, although the acid generated from the acid polymer included in the water-soluble film 603 is supplied also to the unexposed portion 602b of the resist film 602, the quantity of the acid included in the water-soluble film 603 is small, and therefore, the unexposed portion 602b of the resist film 602 remains insoluble in an alkaline developer.

Although the water-soluble film 603 is formed on the resist film 602 in Embodiment 6, the water-soluble film 603 is never dissolved because the immersion lithography is carried out by using the nonaqueous solution 604.

Furthermore, although the water-soluble film 603 is removed by using the alkaline developer in Embodiment 6, the water-soluble film 603 may be removed by using water before or after baking the resist film 602.

Although the water-soluble film 603 includes the acid polymer of polyacrylic acid in Embodiment 6, the water-soluble film 603 may include an acid polymer of polystyrene sulfonic acid instead.

What is claimed is:

1. A pattern formation method comprising the steps of:
   forming, on a substrate, a resist film made from a chemically amplified resist material;
   forming, on said resist film, a water-soluble film including an acid generator for generating an acid through irradiation with light;
   performing pattern exposure by selectively irradiating said resist film with exposing light while providing a nonaqueous solution between said water-soluble film and a projection lens; and
   forming a resist pattern by developing said resist film after the pattern exposure.

2. The pattern formation method of claim 1,
   wherein said nonaqueous solution is perfluoropolyether.

3. The pattern formation method of claim 1,
   wherein said acid generator is an onium salt.

4. The pattern formation method of claim 1,
   wherein said water-soluble film is a polyvinyl alcohol film or polyvinyl pyrrolidone film.

5. The pattern formation method of claim 1,
   wherein said nonaqueous solution is provided directly on said water-soluable film during said pattern exposure.

6. A pattern formation method comprising the steps of:
   forming, on a substrate, a resist film made from a chemically amplified resist material;
   forming, on said resist film, a water-soluble film including an acid;
   performing pattern exposure by selectively irradiating said resist film with exposing light while providing a nonaqueous solution between said water-soluble film and a projection lens; and
   forming a resist pattern by developing said resist film after the pattern exposure.

7. The pattern formation method of claim 6,
   wherein said nonaqueous solution is perfluoropolyether.

8. The pattern formation method of claim 6,
   wherein said acid is acetic acid.

9. The pattern formation method of claim 6,
   wherein said water-soluble film is a polyvinyl alcohol film or a polyvinyl pyrrolidone film.

10. The pattern formation method of claim 6,
    wherein said nonaqueous solution is provided directly on said water-soluable film during said pattern exposure.

11. A pattern formation method comprising the steps of:
    forming, on a substrate, a resist film made from a chemically amplified resist material;
    forming, on said resist film, a water-soluble film including an acid polymer;
    performing pattern exposure by selectively irradiating said resist film with exposing light while providing a nonaqueous solution between said water-soluble film and a projection lens; and
    forming a resist pattern by developing said resist film after the pattern exposure.

12. The pattern formation method of claim 11,
    wherein said nonaqueous solution is perfluoropolyether.

13. The pattern formation method of claim 11,
    wherein said acid polymer is polyacrylic acid or polystyrene sulfonic acid.

14. The pattern formation method of claim 11,
    wherein said nonaqueous solution is provided directly on said water-soluable film during said pattern exposure.

* * * * *